(12) United States Patent
Costa (10) Patent No.: US 11,222,878 B2
(45) Date of Patent: Jan. 11, 2022

(54) ELECTRONIC POWER MODULE

(71) Applicant: AB Mikroelektronik Gesellschaft mit beschraenkter Haftung, Salzburg (AT)

(72) Inventor: Louis Costa, Grödig (AT)

(73) Assignee: AB Mikroelektronik Gesellschaft mit beschraenkter Haftung, Salzburg (AT)

( * ) Notice: Subject to any disclaimer, the term of this patent is extended or adjusted under 35 U.S.C. 154(b) by 0 days.

(21) Appl. No.: 16/851,450

(22) Filed: Apr. 17, 2020

(65) Prior Publication Data
US 2020/0350299 A1    Nov. 5, 2020

Related U.S. Application Data

(60) Provisional application No. 62/840,636, filed on Apr. 30, 2019.

(51) Int. Cl.
*H01L 25/11* (2006.01)
*H01L 23/495* (2006.01)
(Continued)

(52) U.S. Cl.
CPC ........ *H01L 25/115* (2013.01); *H01L 21/4842* (2013.01); *H01L 21/56* (2013.01);
(Continued)

(58) Field of Classification Search
CPC ............... H01L 25/115; H01L 23/3675; H01L 23/49537; H01L 23/49579; H01L 21/4842;
(Continued)

(56) References Cited

U.S. PATENT DOCUMENTS

| 4,795,670 A | 1/1989 | Nishigaki |
| 5,033,666 A | 7/1991 | Keusseyan et al. |

(Continued)

FOREIGN PATENT DOCUMENTS

| DE | 19900910 | 7/2000 |
| EP | 0 453 858 | 10/1991 |

(Continued)

OTHER PUBLICATIONS

Hatch, Aluminum: Properties and Physical Metallurgy, ASM International, (1984), pp. 47.

(Continued)

*Primary Examiner* — Peniel M Gumedzoe
(74) *Attorney, Agent, or Firm* — Dority & Manning, P.A.

(57) ABSTRACT

Electronic power modules are disclosed. In one example, an electronic power module includes a first aluminum substrate, a second aluminum substrate, and a third aluminum substrate arranged in a common plane. The electronic power module includes first gap separating the first aluminum substrate from the second aluminum substrate. The electronic power module includes a second gap separating the second aluminum substrate from the third aluminum substrate. The electronic power module includes a first semiconductor switching component electrically coupled to the first aluminum substrate and the second aluminum substrate. The electronic power module includes a second semiconductor switching component electrically coupled to the second aluminum substrate and the third aluminum substrate.

20 Claims, 8 Drawing Sheets

(51) Int. Cl.
*H01L 23/00* (2006.01)
*H01L 21/48* (2006.01)
*H01L 23/367* (2006.01)
*H01L 21/56* (2006.01)

(52) U.S. Cl.
CPC .... *H01L 23/3675* (2013.01); *H01L 23/49537* (2013.01); *H01L 23/49579* (2013.01); *H01L 24/32* (2013.01); *H01L 24/83* (2013.01); *H01L 24/48* (2013.01); *H01L 24/73* (2013.01); *H01L 2224/48091* (2013.01); *H01L 2224/48247* (2013.01); *H01L 2224/73265* (2013.01)

(58) Field of Classification Search
CPC ......... H01L 21/56; H01L 24/32; H01L 24/83; H01L 24/48; H01L 24/73; H01L 2224/48091; H01L 2224/48247; H01L 2224/73265
See application file for complete search history.

(56) References Cited

U.S. PATENT DOCUMENTS

| | | | |
|---|---|---|---|
| 5,058,799 | A | 10/1991 | Zsamboky |
| 5,256,469 | A | 10/1993 | Cherukuri et al. |
| 5,496,619 | A | 3/1996 | Itagaki et al. |
| 5,543,210 | A | 8/1996 | Kullander et al. |
| 5,573,632 | A | 11/1996 | Shimizu |
| 5,690,271 | A | 11/1997 | Dudel |
| 5,882,722 | A | 3/1999 | Kydd |
| 6,074,893 | A | 6/2000 | Nakata et al. |
| 6,124,769 | A | 9/2000 | Igarashi |
| 6,221,427 | B1 | 4/2001 | Wen et al. |
| 6,736,988 | B1 | 5/2004 | Gaku et al. |
| 8,497,448 | B2 | 7/2013 | Barkhausen et al. |
| 9,414,512 | B2 | 8/2016 | Nagatomo et al. |
| 2002/0105775 | A1 | 8/2002 | Suzuki et al. |
| 2006/0213604 | A1 | 9/2006 | Fukui et al. |
| 2007/0080360 | A1 | 4/2007 | Mirsky |
| 2007/0085112 | A1 | 4/2007 | Yamazaki |
| 2007/0142530 | A1 | 6/2007 | Kajimura et al. |
| 2011/0180818 | A1 | 7/2011 | Lerman |
| 2011/0303885 | A1 | 12/2011 | Vanheusden |
| 2012/0015152 | A1 | 1/2012 | Takahashi et al. |
| 2013/0248777 | A1 | 9/2013 | Sgriccia |
| 2013/0335921 | A1 | 12/2013 | Nagatomo et al. |
| 2015/0044360 | A1 | 2/2015 | Burns et al. |
| 2017/0103978 | A1 | 4/2017 | Prechtl et al. |
| 2017/0287819 | A1 | 10/2017 | Fukase et al. |
| 2018/0145007 | A1* | 5/2018 | Hatano ................. H01L 25/18 |
| 2018/0151481 | A1 | 5/2018 | Otremba et al. |
| 2018/0183427 | A1 | 6/2018 | Nakajima et al. |

FOREIGN PATENT DOCUMENTS

| | | |
|---|---|---|
| EP | 0543121 | 5/1993 |
| EP | 546560 | 6/1993 |
| EP | 1939937 | 7/2008 |
| JP | 49-675 | 1/1974 |
| JP | 54-41233 | 4/1979 |
| JP | 54-41234 | 4/1979 |
| JP | 58-27327 | 2/1983 |
| JP | 61-133382 | 6/1986 |
| JP | 1-198404 | 8/1989 |
| JP | 4-107276 | 4/1992 |
| JP | 4-302194 | 10/1992 |
| JP | 61-264784 | 11/1998 |
| JP | 63-305592 | 12/1998 |
| JP | 2008-166344 | 7/2008 |
| JP | 2009-87957 | 4/2009 |
| JP | 2010-238614 | 10/2010 |
| JP | 2011-201760 | 10/2011 |
| JP | 2012-33291 | 2/2012 |
| JP | 2012136722 | 7/2012 |
| KR | 10-2008-0069922 | 7/2008 |
| WO | WO 95/13902 | 5/1995 |
| WO | WO 2007/128015 | 11/2007 |

OTHER PUBLICATIONS

Mondolfo, Aluminum Alloys, Elsevier, 1st Ed., (1976), pp. 354.
International Search Report and Written Opinion for Application No. PCT/AT2020/060167, dated Sep. 4, 2020, 19 pages.

* cited by examiner

ELECTRONIC POWER MODULE

PRIORITY CLAIM

The present application claims the benefit of priority of U.S. Provisional Application Ser. No. 62/840,636, titled "Electronic Power Module," filed on Apr. 30, 2019, which is incorporated herein by reference.

FIELD

The present disclosure relates generally to electronic power modules, and more particularly to electronic power modules for use in high power applications, such as, for instance, power conversion, power storage systems, electric drive control, etc.

BACKGROUND

Electronic power modules can be used in various electrical switching applications. For instance, electronic power modules can be used for power conversion, power storage systems (e.g., connecting/disconnecting of battery storage systems), electric drive control (e.g., for automotive applications). Power modules can include one or more solid state switching device(s) (e.g., MOSFETs, IGBTs, etc.). For instance, a power module can include solid state switching device(s) arranged to implement a bidirectional switch, an inverter bridge, etc. To accommodate higher power requirements in electronic power module applications, the solid state device(s) can be implemented on a metal circuit carrier, such as an aluminum circuit carrier.

SUMMARY

Aspects and advantages of embodiments of the present disclosure will be set forth in part in the following description, or may be learned from the description, or may be learned through practice of the embodiments.

One example aspect of the present disclosure is directed to an electronic power module. The electronic power module includes a first aluminum substrate operable at a first potential. The electronic power module includes a second aluminum substrate operable at a second potential. The second aluminum substrate is arranged in a common plane with the first aluminum substrate. The electronic power module includes a third aluminum substrate operable at a third potential. The third aluminum substrate is arranged in a common plane with the first aluminum substrate and the second aluminum substrate. The electronic power module includes first gap separating the first aluminum substrate from the second aluminum substrate. The electronic power module includes a second gap separating the second aluminum substrate from the third aluminum substrate. The electronic power module includes a first semiconductor switching component electrically coupled to the first aluminum substrate and the second aluminum substrate. The electronic power module includes a second semiconductor switching component electrically coupled to the second aluminum substrate and the third aluminum substrate.

These and other features, aspects and advantages of various embodiments will become better understood with reference to the following description and appended claims. The accompanying drawings, which are incorporated in and constitute a part of this specification, illustrate embodiments of the present disclosure and, together with the description, serve to explain the related principles.

BRIEF DESCRIPTION OF THE DRAWINGS

Detailed discussion of embodiments directed to one of ordinary skill in the art are set forth in the specification, which makes reference to the appended figures, in which.

DETAILED DESCRIPTION

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment. Thus, it is intended that aspects of the present disclosure cover such modifications and variations.

Example aspects of the present disclosure are directed to electronic power modules and methods of manufacturing electronic power modules. The electronic power modules can have an improved layout for implementing high performance power switching technology. The electronic power modules can be manufacturing according to the example processes described herein using cost effective techniques from rigid aluminum substrates to provide high performance electronic power modules.

In some embodiments, the electronic power modules can be used to implement a bidirectional solid state switch. For instance, a power module having semiconductor switching components (e.g., MOSFETs) in an anti-serial configuration can allow for controlling current flow in a bidirectional manner. Capability for handling higher currents in power electronic modules can be based at least in part by intrinsic on-state resistance of individual semiconductor switching components. This resistance can be scaled down by parallel connection of more semiconductor switching components. This can increase the size of the area of the semiconductor switching components connected to the circuit carrier of the power electronic module. As an example, using bare die chip semiconductor switching components with a typical on-state resistance of 1.3 mOhm per chip at 25° C. can lead to a total on-state resistance of 0.65 mOhm at 25° C. for four chips connected in parallel per module. At junction temperature of the semiconductor switching components at 175° C., this can least to about one kilowatt power dissipation at about 900 amps current flow.

Electronic power modules for implementing a bidirectional solid state switch can include a first semiconductor switching component and a second semiconductor switching component arranged in an anti-serial configuration. The electronic power modules can include a plurality of anti-serial connected first and second semiconductor switching components arranged in parallel. The semiconductor switching components can be arranged on co-planar aluminum substrate sub-elements with gaps between the sub-elements as will be described in detail below.

In some embodiments, the electronic power modules can be used for single phase inverter bridges. These power modules can be used to convert DC power to AC power in various power systems, such as various electrical motor drive applications (e.g., automotive electrical motor drive applications). The power modules can also be used in other power converters, such as DC-DC power converts, AC to DC power converts, etc. The bridge can be a full bridge, half bridge, H-bridge, asymmetric H-bridge, etc. by rearranging components on the power module.

The electronic power modules can include a first semiconductor switching component and a second semiconductor switching component arranged in a serial configuration. The electronic power modules can include a plurality of serial connected first and second semiconductor switching components connected in a parallel. The semiconductor switching components can be arranged on co planar aluminum substrate sub-elements with gaps between the sub-elements as will be described in detail below.

According to example aspects of the present disclosure, an electronic power module suitable for use in the above described applications can be made from rigid aluminum substrates. The rigid aluminum substrates can have a thickness, for instance, in the range of about 0.5 mm to about 3.5 mm, such as about 2.0 mm. As used herein, the use of the term "about" in conjunction with a numerical value refers to within 15% of the stated numerical value.

The aluminum substrate can be punched into individual sub-elements, such as a first aluminum substrate, a second aluminum substrate, and a third aluminum substrate. The sub-elements can act as current busbars for the electronic power module. During the manufacturing process after the initial punching, the first aluminum substrate, the second aluminum substrate, and the third aluminum substrate can be connected by bridges. The first aluminum substrate, the second aluminum substrate, and the third aluminum substrate can define substrate areas that correspond to drain, source, and gate regions for connecting semiconductor switching components. Thick film screen printing processes can print an electrical circuit (e.g., gate driving circuitry, conductive tracks, etc.) on one or more of the aluminum substrates. A surface mount assembly process can attach electrical components (e.g., passive electrical components, such as resistors, Zener diodes, capacitors, pin connectors, bond preforms), sensors (e.g., shunt resistors, hall sensors, etc.) and/or semiconductor switching components (e.g., MOSFETs, IGBTs, FETs, SiC MOSFETs, SiC Shottky diodes, GaN HEMT, etc.)) to the aluminum substrates.

After assembly, the power module can be mechanically stabilized by attaching the substrate to a heat spreader (e.g., a conductive plate, such as an aluminum plate) via an isolating layer coupled between the aluminum substrate and the heat spreader. The isolating layer can be, for instance, adhesive tape, glue layer, gap filler, etc.

A multiple pin connector with metallized pins can be soldered or otherwise connected to the power module. In addition and/or in the alternative, wire bond or ribbon bond preforms can be implemented for wire bonding or ribbon bonding the circuit carrier to a control circuit (e.g., a separate circuit carrier associated with control for the electronic power module.

The bridges between the aluminum substrate sub-elements can be punched to create a gap between the aluminum sub-elements. The gap can be an air gap or can be filled with an isolating material (e.g., epoxy resin, silicone, potting compound, etc.). The gap can have a size and configuration to assure proper insulation standards between the aluminum substrate sub-elements. The power module can be encased or otherwise packaged in a packaging material (e.g., plastic material).

Aspects of the present disclosure provide a number of technical effects and benefits. For instance, the apparatus and methods according to example aspects of the present disclosure can provide for higher design flexibility for single side cooled electronic power modules. The electronic power modules can be manufactured using relatively cost effective techniques using an aluminum substrate which can also provide high performance for thermal and electrical conductivity. The methods for manufacturing the electronic power modules can be implemented in a short production process with lower high volume production risks. The configuration of the electronic power module can provide for flexibility in the sourcing of semiconductor components used in the electronic power module.

The electronic power module includes a first aluminum substrate operable at a first potential. The electronic power module includes a second aluminum substrate operable at a second potential. The second aluminum substrate is arranged in a common plane with the first aluminum substrate. The electronic power module includes a third aluminum substrate operable at a third potential. The third aluminum substrate is arranged in a common plane with the first aluminum substrate and the second aluminum substrate. The electronic power module includes first gap separating the first aluminum substrate from the second aluminum substrate. The electronic power module includes a second gap separating the second aluminum substrate from the third aluminum substrate. The electronic power module includes a first semiconductor switching component electrically coupled to the first aluminum substrate and the second aluminum substrate. The electronic power module includes a second semiconductor switching component electrically coupled to the second aluminum substrate and the third aluminum substrate.

In some embodiments, the first semiconductor switching component and the second semiconductor switching component are arranged in an anti-serial connection. For instance, the first aluminum substrate provides a drain connection for the first semiconductor switching component. The third aluminum substrate provides a drain connection for the second semiconductor switching component. The second aluminum substrate provides a gate connection and a source connection for the first semiconductor switching component and a gate connection and a source connection for the second semiconductor switching component. In some applications, the electronic power module is configured as a bidirectional solid state switch.

The second aluminum substrate can be arranged between the first aluminum substrate and the third aluminum substrate. In some embodiments, control circuitry can be disposed on the second aluminum substrate.

In particular implementations, the first semiconductor switching component includes a drain connection pad, a source connection pad, and a gate connection pad arranged on a same side of a first semiconductor package for the first semiconductor switching component. The second semiconductor switching component comprises a drain connection pad, a source connection pad, and a gate connection pad arranged on a same side of a second semiconductor package for the second semiconductor switching component. The first semiconductor package spans the first gap and the second semiconductor package spans the second gap.

The drain connection pad of the first semiconductor switching component is die attached to the first aluminum substrate. The drain connection pad of the second semiconductor switching component is die attached to the third aluminum substrate. The gate connection pad and the source connection pad of the first semiconductor switching component is die attached to the second aluminum substrate. The gate connection pad and the source connection pad of the second semiconductor switching component is die attached to the second aluminum substrate.

In particular implementations, the first semiconductor switching component includes a drain connection pad, a source connection pad, and a gate connection pad. The drain connection pad and the gate connection pad arranged on opposite sides of a first semiconductor package for the first semiconductor switching component. The second semiconductor switching component comprises a drain connection pad, a source connection pad, and a gate connection pad. The drain connection pad and the gate connection pad arranged on opposite sides of a second semiconductor package for the second semiconductor switching component.

The drain connection pad of the first semiconductor switching component is die attached to the first aluminum substrate. The drain connection pad of the second semiconductor switching component is die attached to the third aluminum substrate. The gate connection pad and the source connection pad of the first semiconductor switching component are wire bonded or ribbon bonded to the second aluminum substrate. The gate connection pad and the source connection pad of the second semiconductor switching component are wire bonded or ribbon bonded to the second aluminum substrate.

In some embodiments, the first semiconductor switching component and the second semiconductor switching component are arranged in a serial connection. For instance, the first aluminum substrate provides a drain connection for the first semiconductor switching component. The second aluminum substrate provides a source connection and a gate connection for the first semiconductor switching component. The second aluminum substrate provides a drain connection and a source connection for the second semiconductor switching component. The third aluminum substrate provides a gate connection for the second semiconductor switching component. The second aluminum substrate can be arranged between the first aluminum substrate and the third aluminum substrate. In some applications, the electronic power module is configured as a single phase inverter bridge.

In particular implementations, the first semiconductor switching component includes a drain connection pad, a source connection pad, and a gate connection pad arranged on a same side of a first semiconductor package for the first semiconductor switching component. The second semiconductor switching component comprises a drain connection pad, a source connection pad, and a gate connection pad arranged on a same side of a second semiconductor package for the second semiconductor switching component. The first semiconductor package spans the first gap and the second semiconductor package spans the second gap.

The drain connection pad of the first semiconductor switching component is die attached to the first aluminum substrate. The connection pad and the gate connection pad of the first semiconductor switching component is die attached to the second aluminum substrate. The drain connection pad of the second semiconductor switching component is die attached to the second aluminum substrate. The source connection pad and the gate connection pad is die attached to the third aluminum substrate.

In particular implementations, the first semiconductor switching component includes a drain connection pad, a source connection pad, and a gate connection pad. The drain connection pad and the gate connection pad arranged on opposite sides of a first semiconductor package for the first semiconductor switching component. The second semiconductor switching component comprises a drain connection pad, a source connection pad, and a gate connection pad. The drain connection pad and the gate connection pad arranged on opposite sides of a second semiconductor package for the second semiconductor switching component.

The drain connection pad of the first semiconductor switching component is die attached to the first aluminum substrate. The gate connection pad of the first semiconductor switching component is wire bonded or ribbon bonded to the second aluminum substrate. The source connection pad of the first semiconductor switching component is wire bonded or ribbon bonded to the second aluminum substrate. The drain connection pad of the second semiconductor switching component is die attached to the second aluminum substrate. The source connection pad of the second semiconductor switching component is wire bonded or ribbon bonded to the third aluminum substrate. The gate connection pad of the second semiconductor switching component is wire bonded or ribbon bonded to the third aluminum substrate.

In some embodiments, the electronic power module can further include a connector coupled to the first aluminum substrate, the second aluminum substrate, and the third aluminum substrate. The first aluminum substrate, the second aluminum substrate, and the third aluminum substrate can each be a bus bar. Aa thickness of the first aluminum substrate, the second aluminum substrate, and the third aluminum substrate can be in the range of about 0.5 mm to about 3.5 mm.

In some embodiments, the first gap and the second gap each include air. In some embodiments, the first gap and the second gap each include an insulating material.

In some embodiments, the first aluminum substrate, the second aluminum substrate, and the third aluminum substrate are attached to a heat spreader via an isolating layer. The isolating layer can be, for instance, an adhesive tape.

In some embodiments, the first semiconductor switching component and the second semiconductor switching component each include a MOSFET, IGBT, SiC MOSFET, SiC Shottky diode, or GaN HEMT. The first aluminum substrate, the second aluminum substrate, and the third aluminum substrate can be treated with a pulsed laser pretreatment process.

Another example embodiment of the present disclosure is directed to a method of manufacturing an electronic power module. The method includes punching the first aluminum substrate, the second aluminum substrate, and the third aluminum substrate from a sheet of aluminum such that the first gap separates the first aluminum substrate from the second aluminum substrate and the second gap separates the second aluminum substrate from the third aluminum substrate; the first aluminum substrate connected to the second aluminum substrate by one or more bridges; the second aluminum substrate connected to the third aluminum substrate by one or more bridges; The method includes screen printing one or more circuit components on the first aluminum substrate, the second aluminum substrate, and the third aluminum substrate. The method includes connecting the first semiconductor switching component to the first aluminum substrate and the second aluminum substrate. The method includes connecting the second semiconductor switching component to the second aluminum substrate and the third aluminum substrate. The method includes attaching the first aluminum substrate, second aluminum substrate, and the third aluminum substrate to a heat spreader via an isolating layer. The method includes punching the one or more bridges connecting the first aluminum substrate and the second aluminum substrate and the one or more bridges connecting the second aluminum substrate and the third aluminum substrate to separate the first aluminum substrate from the second aluminum substrate and to separate the second aluminum substrate from the third aluminum substrate. The method can include covering the first aluminum substrate, the second aluminum substrate, and the third aluminum substrate with a packaging material.

Figure 1:
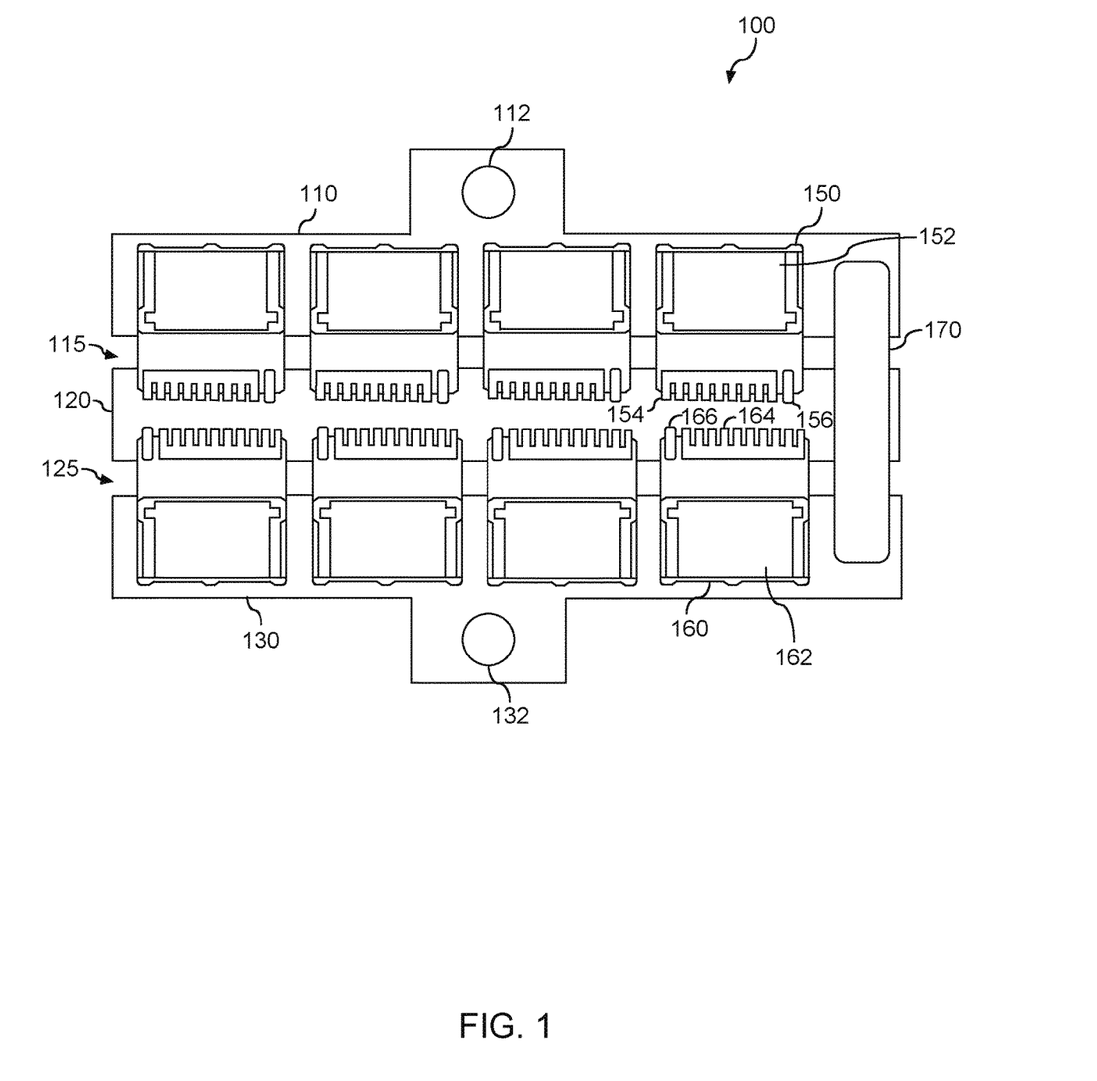
FIG. 1 depicts an electronic power module according to example embodiments of the present disclosure.

FIG. 1 depicts an electronic power module 100 according to example embodiments of the present disclosure. The power module 100 includes three aluminum substrate sub-elements. More particularly, the power module 100 includes a first aluminum substrate 110, a second aluminum substrate 120, and a third aluminum substrate 130. The first aluminum substrate 110, the second aluminum substrate 120, and third aluminum substrate 130 are arranged in a common plane. As shown, the second aluminum substrate 120 is arranged between the first aluminum substrate 110 and the third aluminum substrate 130. Each of the aluminum substrate sub-elements (e.g., first aluminum substrate 110, second aluminum substrate 120, and third aluminum substrate 130) can be rigid aluminum having a thickness in the range of about 0.5 mm to about 3.5 mm, such as about 2.0 mm.

A first gap 115 can be disposed between the first aluminum substrate 110 and the second aluminum substrate 120. A second gap 125 can be disposed between the second aluminum substrate 120 and the third aluminum substrate 130. The first gap 115 and the second gap 125 can be an air gap. In some embodiments, the first gap 115 and the second gap 125 can be at least partially filled (e.g., completely filled) with an isolating material (e.g., insulating material). The isolating material can be, for instance, an epoxy resin, silicone, a potting compound, or other isolating material. The first gap 115 and the second gap 125 can have a size to meet insulation standards (e.g., EN60664-1, UL 840, etc.).

The first aluminum substrate 110 can include a connection 112. The terminal connection 112 can be used to mechanically mount the electronic power module 100. The third aluminum substrate 130 can include a connection 132. The connection 132 can be used to mechanically mount the electronic power module 100.

The power module 100 can include a plurality of semiconductor switching components, including a first semiconductor switching component 150 and a second semiconductor switching component 160 arranged in anti-serial configuration to implement a bidirectional solid state switch. In the example embodiment of FIG. 2, eight semiconductor switching components are illustrated (four parallel connections of anti-serial connected semiconductor switching components). However, those of ordinary skill in the art, using the disclosures provided herein, will understand that more or fewer semiconductor switching components can be used without deviating from the scope of the present disclosure.

The semiconductor switching components in FIG. 1 can be, for instance, MOSFETs having connection pads (e.g., gate connection pad, drain connection pad, and source connection pad, arranged on the same side of the semiconductor switching component. For example, a first semiconductor switching component 150 can include a drain connection pad 152, a source connection pad 154, and a gate connection pad 156 arranged on the same side of the package associated with the semiconductor switching component 150. Similarly, the second semiconductor switching component 160 can include a drain connection pad 162, a source connection pad 164, and a gate connection pad 166 arranged on the same side of the package associated with the semiconductor switching component 160. In example embodiments, the first semiconductor switching component 150 and the second semiconductor switching component 160 can be an HSOF-8 chip, JEDEC MO-299 package, TO-LL package, etc.

The first aluminum substrate 110 can provide a drain potential for the first semiconductor switching component 150. More particularly, the first aluminum substrate 110 can provide a drain connection for the first semiconductor switching component 150. For instance, the drain connection pad 152 of the first semiconductor switching component 150 can be die attached (e.g., soldered) to first aluminum substrate 110.

The third aluminum substrate 110 can provide a drain potential for the second semiconductor switching component 160. More particularly, the third aluminum substrate 130 can provide a drain connection for the second semiconductor switching component 160. For instance, the drain connection pad 162 of the semiconductor switching component 160 can be die attached (e.g., soldered) to the third aluminum substrate 130.

The second aluminum substrate 120 can provide a source potential for both the first semiconductor switching component 150 and the second semiconductor switching component 160. More particularly, the second aluminum substrate 120 can provide a source connection for the first semiconductor switching component 150 and the second semiconductor switching component 160. For instance, the source connection pad 154 of the first semiconductor switching component 150 can be die attached (e.g., soldered) to the second aluminum substrate 120. The source connection pad 164 of the second semiconductor switching component 160 can be die attached (e.g., soldered) to the second aluminum substrate 120.

The second aluminum substrate can also include control circuitry (e.g., gate tracks passive components, sensors, traces, etc.) for control of the electronic power module 100. The control circuitry can be screen printed onto the aluminum substrate 120 as will be discussed in more detail below. The gate connection pad 156 of the first semiconductor switching component 150 can be die attached (e.g., soldered) to the second aluminum substrate 120. The gate connection pad 166 of the second semiconductor switching component 160 can be die attached (e.g., soldered) to the second aluminum substrate.

A connector 170 can be coupled to the first aluminum substrate 110, the second aluminum substrate 120, and the third aluminum substrate 130. The connector 170 can include metal pins for providing power and control signals to the power module 100. The connector 170 can be configured to provide the drain potential to the first aluminum substrate 110 and the third aluminum substrate 130. The connector 170 can provide the source potential and control signals to circuitry on the second aluminum substrate 120. Other suitable techniques can be used to provide power and control signals to the power module 100 without deviating from the scope of the present disclosure.

Figure 2:
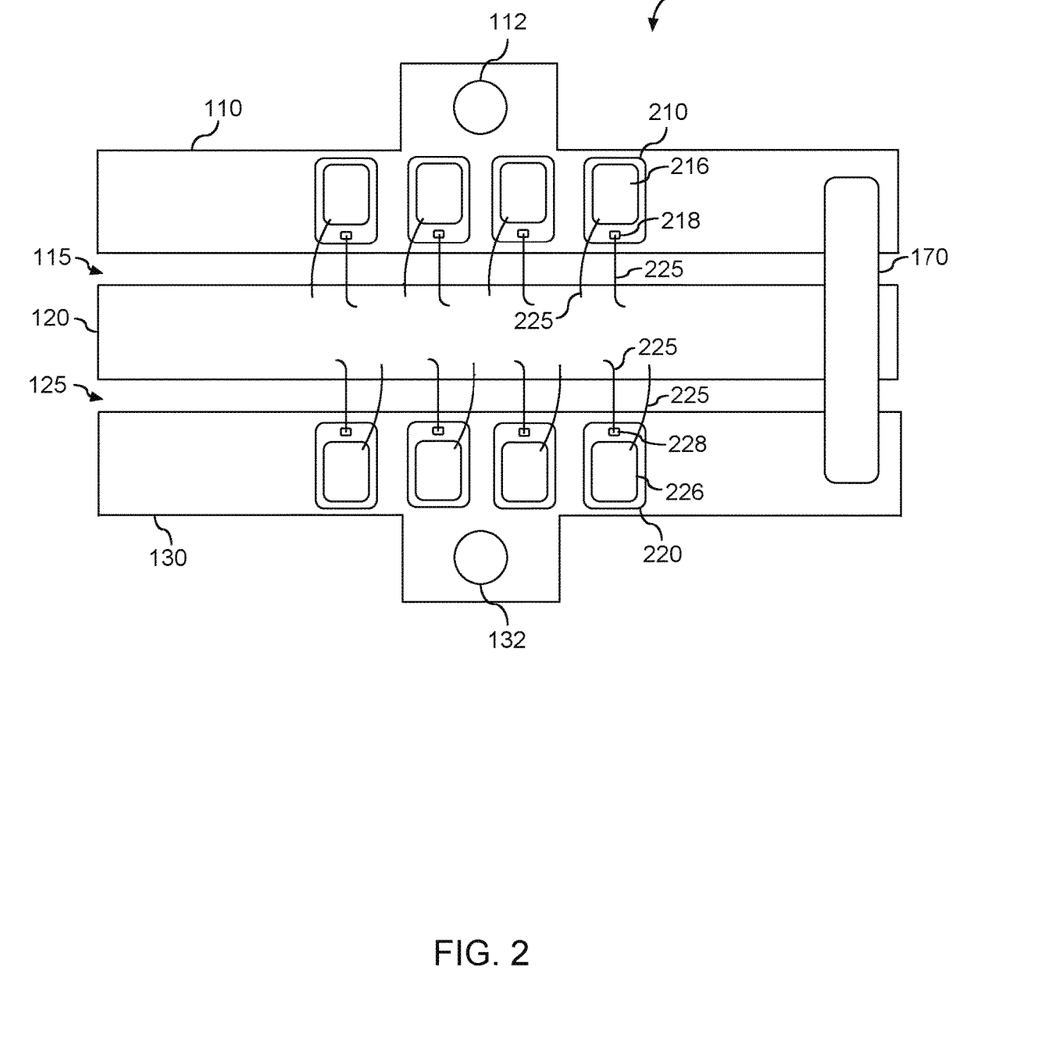
FIG. 2 depicts an electronic power module according to example embodiments of the present disclosure.

FIG. 2 depicts an electronic power module 200 according to example embodiments of the present disclosure. The power module 200 includes three aluminum substrate sub-elements. More particularly, the power module 200 includes a first aluminum substrate 110, a second aluminum substrate 120, and a third aluminum substrate 130. The first aluminum substrate 110, the second aluminum substrate 120, and third aluminum substrate 130 are arranged in a common plane. As shown, the second aluminum substrate 120 is arranged between the first aluminum substrate 110 and the third aluminum substrate 130. Each of the aluminum substrate sub-elements (e.g., first aluminum substrate 110, second aluminum substrate 120, and third aluminum substrate 130) can be rigid aluminum having a thickness in the range of about 0.5 mm to about 3.5 mm, such as about 2.0 mm.

A first gap 115 can be disposed between the first aluminum substrate 110 and the second aluminum substrate 120. A second gap 125 can be disposed between the second aluminum substrate 120 and the third aluminum substrate 130. The first gap 115 and the second gap 125 can be an air gap. In some embodiments, the first gap 115 and the second gap 125 can be at least partially filled (e.g., completely filled) with an isolating material (e.g., insulating material). The isolating material can be, for instance, an epoxy resin, silicone, a potting compound, or other isolating material. The first gap 115 and the second gap 125 can have a size to meet insulation standards (e.g., EN60664-1, UL 840, etc.).

The first aluminum substrate 110 can include a connection 112. The connection 112 can be used to mechanically mount the electronic power module 200. The third aluminum substrate 130 can include a connection 132. The connection 132 can be used to mechanically mount the electronic power module 200.

The power module 200 can include a plurality of semiconductor switching components, including a first semiconductor switching component 210 and a second semiconductor switching component 220 arranged in anti-serial configuration to implement a bidirectional solid state switch. In the example embodiment of FIG. 2, eight semiconductor switching components are illustrated (four parallel connections of anti-serial connected semiconductor switching components). However, those of ordinary skill in the art, using the disclosures provided herein, will understand that more or fewer semiconductor switching components can be used without deviating from the scope of the present disclosure.

The semiconductor switching components in FIG. 2 can be, for instance, bare die semiconductor switching components (e.g., MOSFETs). The semiconductor switching components in FIG. 2 can have a drain connection pad on one side of the component and gate and source connections on the opposing side of the component. For example, a first semiconductor switching component 210 can include a drain connection pad (not shown) on a first side of the component 210. The first semiconductor switching component 210 can include a source connection pad 214 and a gate connection pad 216 arranged on an opposite side of the first semiconductor switching component 210. Similarly, a second semiconductor switching component 220 can include a drain connection pad (not shown) on a first side of the component 220. The second semiconductor switching component 220 can include a source connection pad 224 and a gate connection pad 226 arranged on an opposite side of the second semiconductor switching component 220

The first aluminum substrate 110 can provide a drain potential for the semiconductor switching component 210. More particularly, the first aluminum substrate 110 can provide a drain connection for the first semiconductor switching component 210. For instance, the drain connection pad of the first semiconductor switching component 210 can be soldered or otherwise die attached to first aluminum substrate 110.

The third aluminum substrate 110 can provide a drain potential for the semiconductor switching component 220. More particularly, the third aluminum substrate 130 can provide a drain connection for the second semiconductor switching component 220. For instance, the drain connection pad of the second semiconductor switching component 220 can be soldered or otherwise die attached to the third aluminum substrate 130.

The second aluminum substrate 120 can provide a source potential for both the first semiconductor switching component 210 and the second semiconductor switching component 220. More particularly, the second aluminum substrate 120 can provide a source connection for the first semiconductor switching component 210 and the second semiconductor switching component 220. For instance, the source connection pad 216 of the first semiconductor switching component 210 can be wire bonded or ribbon bonded (e.g., via bond 225) to the second aluminum substrate 120. The source connection pad 226 of the second semiconductor switching component 220 can be wire bonded or ribbon bonded (e.g., via bond 225) to the second aluminum substrate 120.

The second aluminum substrate can also include control circuitry (e.g., gate tracks passive components, sensors, traces, etc.) for control of the electronic power module 200. The control circuitry can be screen printed onto the aluminum substrate 120 as will be discussed in more detail below. The gate connection pad 218 of the first semiconductor switching component 210 can be wire bonded or ribbon bonded (e.g., via bond 225) to the second aluminum substrate 120. The gate connection pad 228 of the second semiconductor switching component 220 can be wire bonded or ribbon bonded (e.g., via bond 225) to the second aluminum substrate 120.

A connector 170 can be coupled to the first aluminum substrate 110, the second aluminum substrate 120, and the third aluminum substrate 130. The connector 170 can include metal pins for providing power and control signals to the power module 200. The connector 170 can be configured to provide the drain potential to the first aluminum substrate 110 and the third aluminum substrate 130. The connector 170 can provide the source potential and control signals to circuitry on the second aluminum substrate 120. Other suitable techniques can be used to provide power and control signals to the power module 200 without deviating from the scope of the present disclosure.

Figure 3:
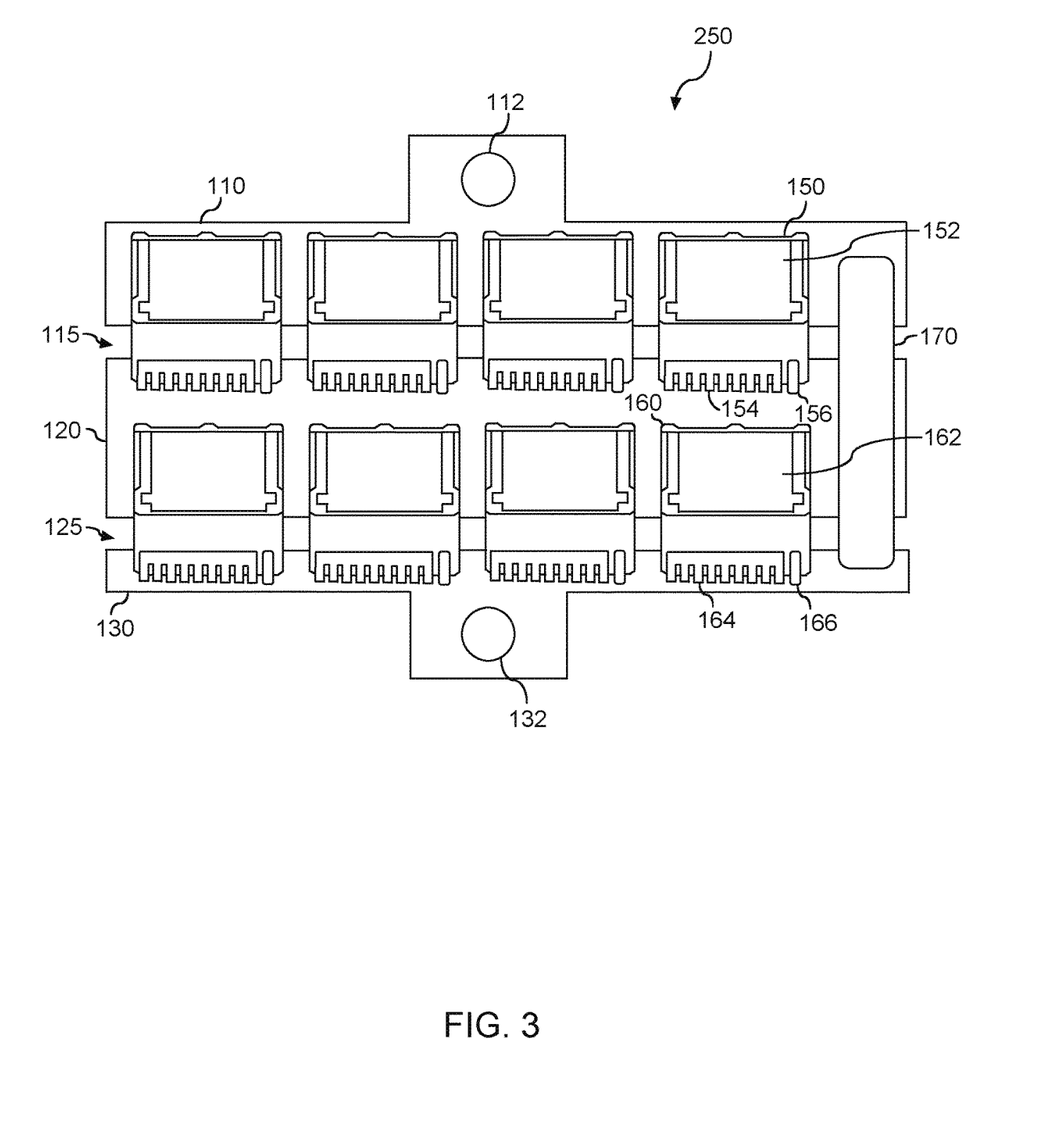
FIG. 3 depicts an electronic power module according to example embodiments of the present disclosure.

FIG. 3 depicts an electronic power module 250 according to example embodiments of the present disclosure. The power module 250 includes three aluminum substrate sub-elements. More particularly, the power module 250 includes a first aluminum substrate 110, a second aluminum substrate 120, and a third aluminum substrate 130. The first aluminum substrate 110, the second aluminum substrate 120, and third aluminum substrate 130 are arranged in a common plane. As shown, the second aluminum substrate 120 is arranged between the first aluminum substrate 110 and the third aluminum substrate 130. Each of the aluminum substrate sub-elements (e.g., first aluminum substrate 110, second aluminum substrate 120, and third aluminum substrate 130) can be rigid aluminum having a thickness in the range of about 0.5 mm to about 3.5 mm, such as about 2.0 mm.

A first gap 115 can be disposed between the first aluminum substrate 110 and the second aluminum substrate 120. A second gap 125 can be disposed between the second aluminum substrate 120 and the third aluminum substrate 130. The first gap 115 and the second gap 125 can be an air gap. In some embodiments, the first gap 115 and the second gap 125 can be at least partially filled (e.g., completely filled) with an isolating material (e.g., insulating material). The isolating material can be, for instance, an epoxy resin, silicone, a potting compound, or other isolating material. The first gap 115 and the second gap 125 can have a size to meet insulation standards (e.g., EN60664-1, UL 840, etc.).

The first aluminum substrate 110 can include a connection 112. The terminal connection 112 can be used to mechanically mount the electronic power module 100. The third aluminum substrate 130 can include a connection 132. The connection 132 can be used to mechanically mount the electronic power module 250.

The power module 250 can include a plurality of semiconductor switching components, including a first semiconductor switching component 150 and a second semiconductor switching component 160 arranged in a serial configuration to implement an inverter bridge. In the example embodiment of FIG. 3, eight semiconductor switching components are illustrated (four parallel connections of serial connected semiconductor switching components). However, those of ordinary skill in the art, using the disclosures provided herein, will understand that more or fewer semiconductor switching components can be used without deviating from the scope of the present disclosure.

The semiconductor switching components in FIG. 3 can be, for instance, MOSFETs having connection pads (e.g., gate connection pad, drain connection pad, and source connection pad, arranged on the same side of the semiconductor switching component. For example, a first semiconductor switching component 150 can include a drain connection pad 152, a source connection pad 154, and a gate connection pad 156 arranged on the same side of the package associated with the semiconductor switching component 150. Similarly, the second semiconductor switching component 160 can include a drain connection pad 162, a source connection pad 164, and a gate connection pad 166 arranged on the same side of the package associated with the semiconductor switching component 160. In example embodiments, the first semiconductor switching component 150 and the second semiconductor switching component 160 can be an HSOF-8 chip, JEDEC MO-299 package, TO-LL package, etc.

The first aluminum substrate 110 can provide a drain potential for the first semiconductor switching component 150. More particularly, the first aluminum substrate 110 can provide a drain connection for the first semiconductor switching component 150. For instance, the drain connection pad 152 of the first semiconductor switching component 150 can be die attached (e.g., soldered) to first aluminum substrate 110.

The second aluminum substrate 120 can provide a drain potential for the second semiconductor switching component 160. More particularly, the second aluminum substrate 120 can provide a drain connection for the second semiconductor switching component 160. For instance, the drain connection pad 162 of the semiconductor switching component 160 can be die attached (e.g., soldered) to the second aluminum substrate 120.

The second aluminum substrate 120 can provide a source potential for the first semiconductor switching component 150. More particularly, the second aluminum substrate 120 can provide a source connection for the first semiconductor switching component 150. For instance, the source connection pad 154 of the first semiconductor switching component 150 can be die attached (e.g., soldered) to the second aluminum substrate 120.

The second aluminum substrate can also include control circuitry (e.g., gate tracks passive components, sensors, traces, etc.) for control of the electronic power module 250. The control circuitry can be screen printed onto the aluminum substrate 120 as will be discussed in more detail below. The gate connection pad 156 of the first semiconductor switching component 150 can be die attached (e.g., soldered) to the second aluminum substrate 120.

The third aluminum substrate 130 can provide a source potential for the second semiconductor switching component 160. More particularly, the third aluminum substrate 130 can provide a source connection for the second semiconductor switching component 160. For instance, the source connection pad 164 of the second semiconductor switching component 160 can be die attached (e.g., soldered) to the third aluminum substrate 130.

The third aluminum substrate 130 can also include control circuitry (e.g., gate tracks passive components, sensors, traces, etc.) for control of the electronic power module 250. The control circuitry can be screen printed onto the aluminum substrate 130 as will be discussed in more detail below. The gate connection pad 166 of the second semiconductor switching component 160 can be die attached (e.g., soldered) to the third aluminum substrate 130.

A connector 170 can be coupled to the first aluminum substrate 110, the second aluminum substrate 120, and the third aluminum substrate 130. The connector 170 can include metal pins for providing power and control signals to the power module 250. The connector 170 can be configured to provide the drain potential to the first aluminum substrate 110 and the third aluminum substrate 130. The connector 170 can provide the source potential and control signals to circuitry on the second aluminum substrate 120. Other suitable techniques can be used to provide power and control signals to the power module 100 without deviating from the scope of the present disclosure.

Figure 4:
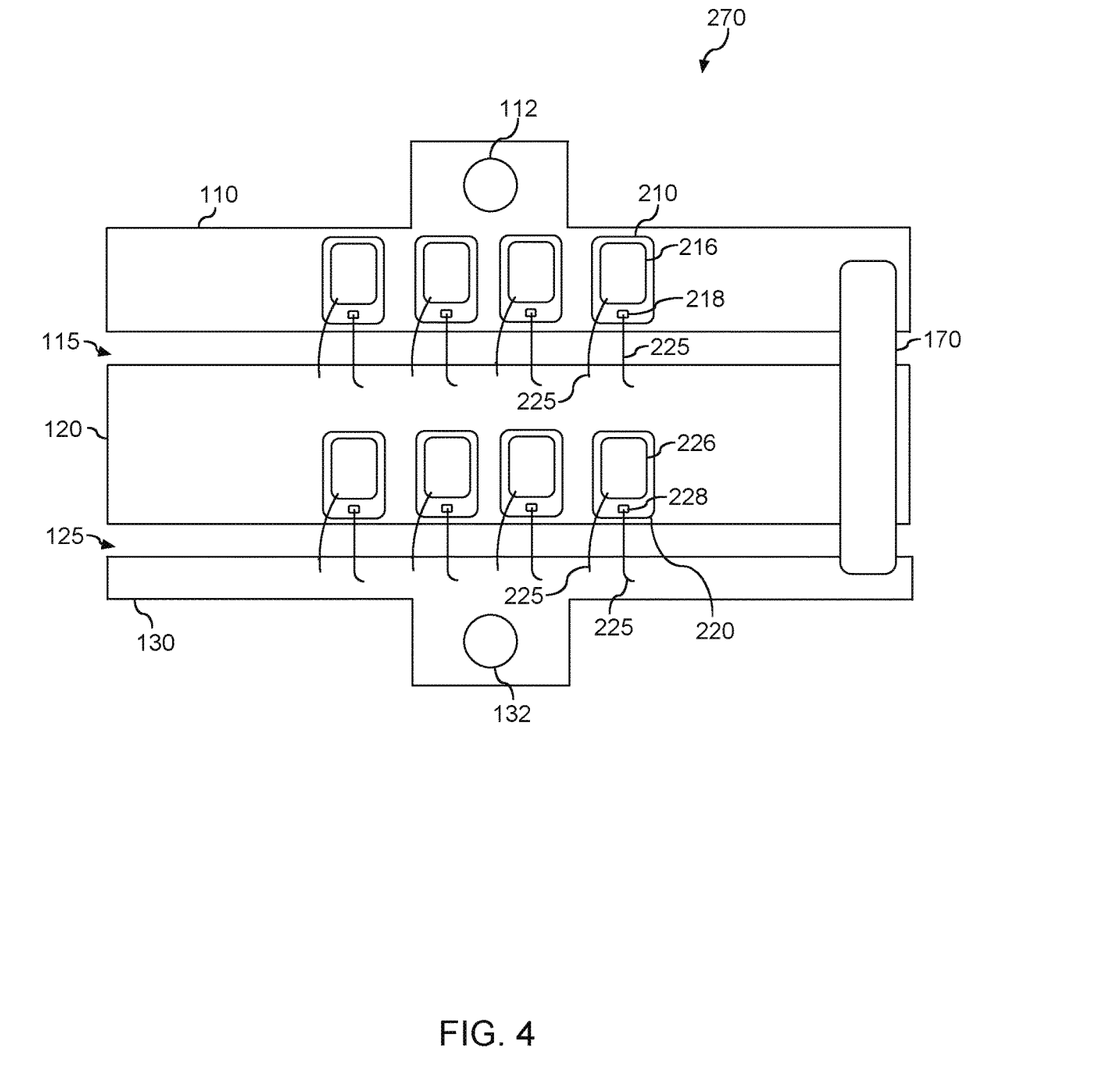
FIG. 4 depicts an electronic power module according to example embodiments of the present disclosure.

FIG. 4 depicts an electronic power module 270 according to example embodiments of the present disclosure. The power module 270 includes three aluminum substrate sub-elements. More particularly, the power module 270 includes a first aluminum substrate 110, a second aluminum substrate 120, and a third aluminum substrate 130. The first aluminum substrate 110, the second aluminum substrate 120, and third aluminum substrate 130 are arranged in a common plane. As shown, the second aluminum substrate 120 is arranged between the first aluminum substrate 110 and the third aluminum substrate 130. Each of the aluminum substrate sub-elements (e.g., first aluminum substrate 110, second aluminum substrate 120, and third aluminum substrate 130) can be rigid aluminum having a thickness in the range of about 0.5 mm to about 3.5 mm, such as about 2.0 mm.

A first gap 115 can be disposed between the first aluminum substrate 110 and the second aluminum substrate 120. A second gap 125 can be disposed between the second aluminum substrate 120 and the third aluminum substrate 130. The first gap 115 and the second gap 125 can be an air gap. In some embodiments, the first gap 115 and the second gap 125 can be at least partially filled (e.g., completely filled) with an isolating material (e.g., insulating material). The isolating material can be, for instance, an epoxy resin, silicone, a potting compound, or other isolating material. The first gap 115 and the second gap 125 can have a size to meet insulation standards (e.g., EN60664-1, UL 840, etc.).

The first aluminum substrate 110 can include a connection 112. The terminal connection 112 can be used to mechanically mount the electronic power module 100. The third aluminum substrate 130 can include a connection 132. The connection 132 can be used to mechanically mount the electronic power module 270.

The power module 270 can include a plurality of semiconductor switching components, including a first semiconductor switching component 210 and a second semiconductor switching component 220 arranged in a serial configuration to implement an inverter bridge. In the example embodiment of FIG. 4, eight semiconductor switching components are illustrated (four parallel connections of serial connected semiconductor switching components). However, those of ordinary skill in the art, using the disclosures provided herein, will understand that more or fewer semiconductor switching components can be used without deviating from the scope of the present disclosure.

The semiconductor switching components in FIG. 4 can be, for instance, bare die semiconductor switching components (e.g., MOSFETs). The semiconductor switching components in FIG. 4 can have a drain connection pad on one side of the component and gate and source connections on the opposing side of the component. For example, a first semiconductor switching component 210 can include a drain connection pad (not shown) on a first side of the component 210. The first semiconductor switching component 210 can include a source connection pad 214 and a gate connection pad 216 arranged on an opposite side of the first semiconductor switching component 210. Similarly, a second semiconductor switching component 220 can include a drain connection pad (not shown) on a first side of the component 220. The second semiconductor switching component 220 can include a source connection pad 224 and a gate connection pad 226 arranged on an opposite side of the second semiconductor switching component 220

The first aluminum substrate 110 can provide a drain potential for the first semiconductor switching component 210. More particularly, the first aluminum substrate 110 can provide a drain connection for the first semiconductor switching component 210. For instance, the drain connection pad (not shown) of the first semiconductor switching component 150 can be die attached (e.g., soldered) to first aluminum substrate 110.

The second aluminum substrate 120 can provide a drain potential for the second semiconductor switching component 220. More particularly, the second aluminum substrate 120 can provide a drain connection for the second semiconductor switching component 220. For instance, the drain connection pad (not shown) of the semiconductor switching component 160 can be die attached (e.g., soldered) to the second aluminum substrate 120.

The second aluminum substrate 120 can provide a source potential for the first semiconductor switching component 210. More particularly, the second aluminum substrate 120 can provide a source connection for the first semiconductor switching component 210. For instance, the source connection pad 216 of the first semiconductor switching component 210 can be wire bonded or ribbon bonded (e.g., via bond 225) to the second aluminum substrate 120.

The second aluminum substrate 120 can also include control circuitry (e.g., gate tracks passive components, sensors, traces, etc.) for control of the electronic power module 270. The control circuitry can be screen printed onto the aluminum substrate 120 as will be discussed in more detail below. The gate connection pad 218 of the first semiconductor switching component 210 can be wire bonded or ribbon bonded (e.g., via bond 225) to the second aluminum substrate 120.

The third aluminum substrate 130 can provide a source potential for the second semiconductor switching component 220. More particularly, the third aluminum substrate 130 can provide a source connection for the second semiconductor switching component 220. For instance, the source connection pad 226 of the second semiconductor switching component 160 can be wire bonded or ribbon bonded (e.g., via bond 225) to the third aluminum substrate 130.

The third aluminum substrate 130 can also include control circuitry (e.g., gate tracks passive components, sensors, traces, etc.) for control of the electronic power module 250. The control circuitry can be screen printed onto the aluminum substrate 130 as will be discussed in more detail below. The gate connection pad 228 of the second semiconductor switching component 220 can be wire bonded or ribbon bonded (e.g., via bond 225) to the third aluminum substrate 130.

A connector 170 can be coupled to the first aluminum substrate 110, the second aluminum substrate 120, and the third aluminum substrate 130. The connector 170 can include metal pins for providing power and control signals to the power module 250. The connector 170 can be configured to provide the drain potential to the first aluminum substrate 110 and the third aluminum substrate 130. The connector 170 can provide the source potential and control signals to circuitry on the second aluminum substrate 120. Other suitable techniques can be used to provide power and control signals to the power module 100 without deviating from the scope of the present disclosure.

Figure 5:
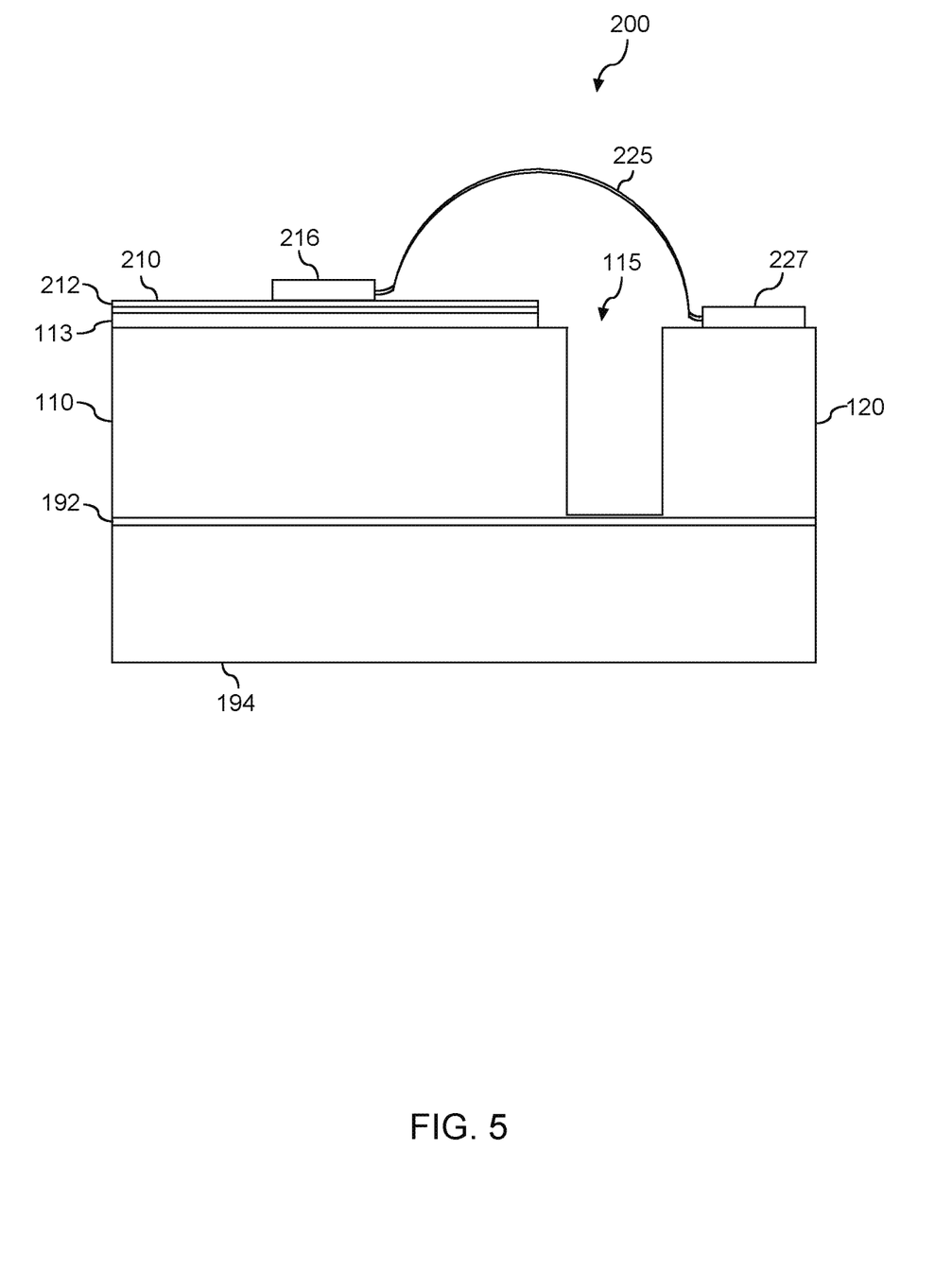
FIG. 5 depicts a cross-sectional view of a portion of an electronic power module according to example embodiments of the present disclosure.

FIG. 5 depicts a cross-sectional view of a portion of the power module 200 according to example embodiments of the present disclosure. As shown, the power module 200 includes a semiconductor switching component 210 that is die attached to a first aluminum substrate 110. More particularly, the semiconductor switching component is die attached to a film metallization layer 113 (e.g., copper, silver, etc.) on the first aluminum substrate 110 via a solder layer 212. A gate connection pad 216 (or other connection) of the first semiconductor switching component 210 is wire bonded (e.g., via wire bond 225) to a connection 227 (e.g., associated with gate track, gate driver, etc.) on the second aluminum substrate 120. A gap 115 separates the first aluminum substrate 110 from the second aluminum substrate 120.

The first aluminum substrate 110 and the second aluminum substrate 120 can be disposed on an optional heat spreader 194. The heat spreader 194 can be, for instance, an aluminum sheet having a thickness in the range of about 4 mm to about 6 mm. The first aluminum substrate 110 and the second aluminum substrate 120 can be attached to the heat spreader 194 via an isolating layer 192. The isolating layer 192 can be, for instance adhesive tape, glue layer, gap filler, etc.

Figure 6:
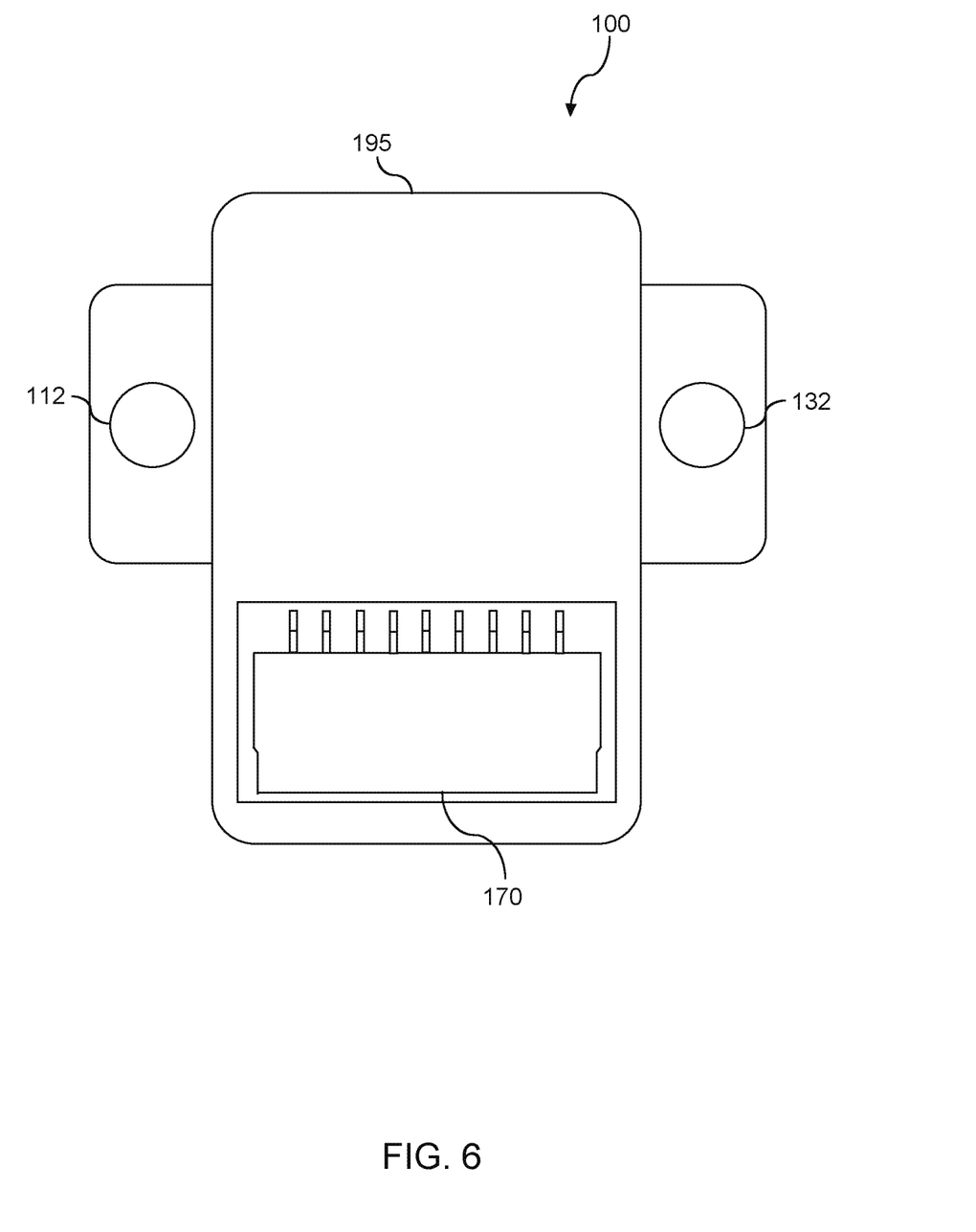
FIG. 6 depicts an electronic power module according to example embodiments of the present disclosure.

FIG. 6 depicts an electronic power module 100 after it has been at least partially encased in packaging 195 (e.g., plastic packaging). As shown, the connector 170 can remain exposed for connection to power source, control boards, etc.

In additions, connectors 112 and 132 can remain exposed for mechanical and/or electrical connection of the power module 100.

Figure 7:
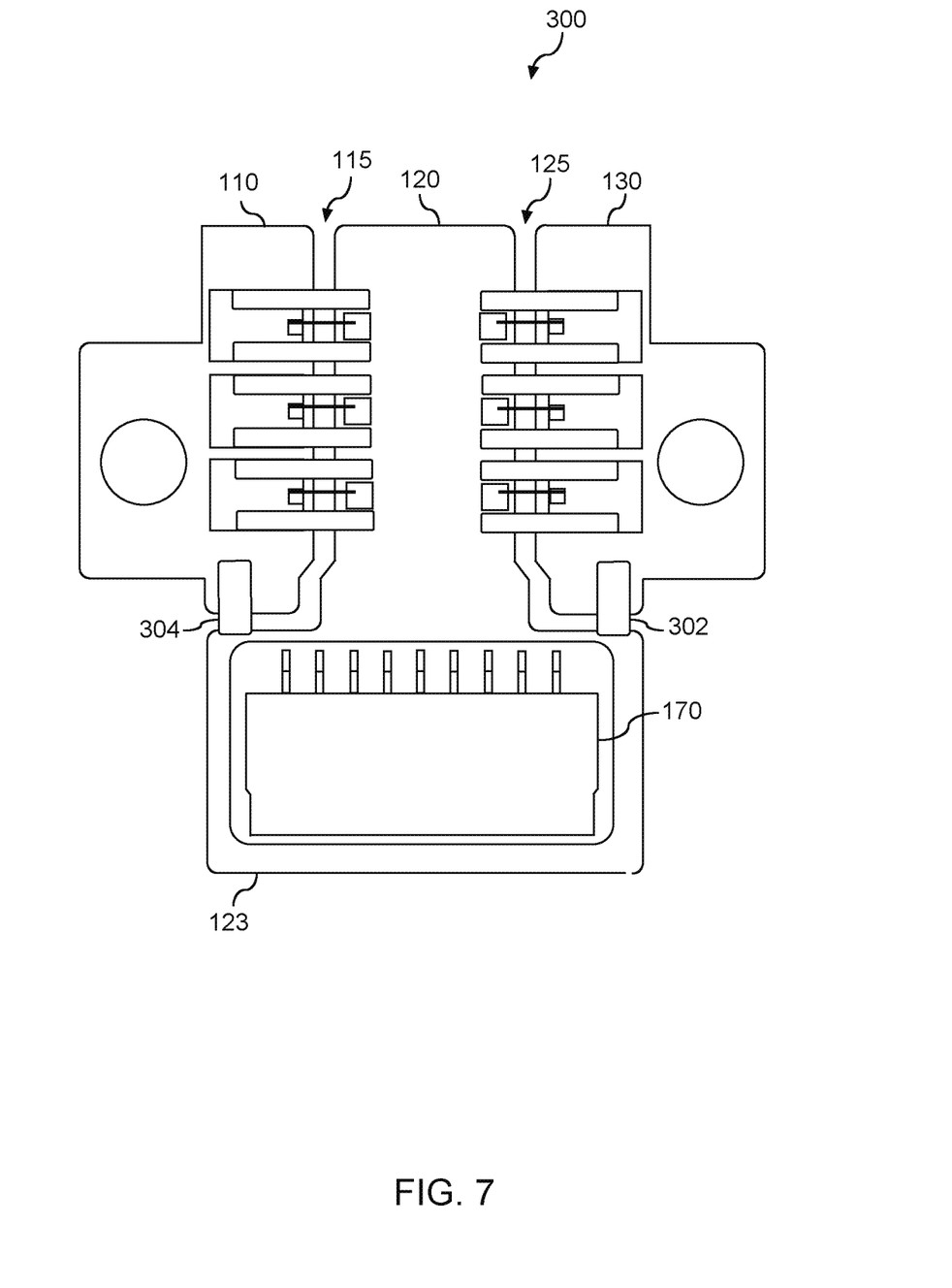
FIG. 7 depicts an electronic power module according to example embodiments of the present disclosure.

FIG. 7 depicts a modified construction of an electronic power module 300 according to example embodiments of the present disclosure. The power module 300 includes three aluminum substrate sub-elements. More particularly, the power module 300 includes a first aluminum substrate 110, a second aluminum substrate 120, and a third aluminum substrate 130. The first aluminum substrate 110, the second aluminum substrate 120, and third aluminum substrate 130 are arranged in a common plane. As shown, the second aluminum substrate 120 is arranged between the first aluminum substrate 110 and the third aluminum substrate 130. Each of the aluminum substrate sub-elements (e.g., first aluminum substrate 110, second aluminum substrate 120, and third aluminum substrate 130) can be rigid aluminum having a thickness in the range of about 0.5 mm to about 3.5 mm.

A first gap 115 can be disposed between the first aluminum substrate 110 and the second aluminum substrate 120. A second gap 125 can be disposed between the second aluminum substrate 120 and the third aluminum substrate 130. The first gap 115 and the second gap 125 can be an air gap. In some embodiments, the first gap 115 and the second gap 125 can be at least partially filled (e.g., completely filled) with an isolating material (e.g., insulating material). The isolating material can be, for instance, an epoxy resin, silicone, a potting compound, or other isolating material. The first gap 115 and the second gap 125 can have a size to meet insulation standards (e.g., EN60664-1, UL 840, etc.). Semiconductor switching components can be arranged on the electronic power module in a manner similar to that described with reference to FIGS. 1-4.

As shown in FIG. 7, the second aluminum substrate 120 has a widened portion 123 to accommodate the entire footprint of the connector 170. Appropriate electrical connections from the connector 170 to the first aluminum substrate 110 can be implemented using electrical conductor 304 (e.g., bond). Appropriate electrical connections from the connector 170 to the third aluminum substrate 130 can be implemented using electrical conductor 302 (e.g., bond). This configuration can allow complete overmolding of the power module as plastic compound does not flow underneath the connector component. In addition, the connector area can be sealed by pressing on a flat substrate area around the connector 170.

Figure 8:
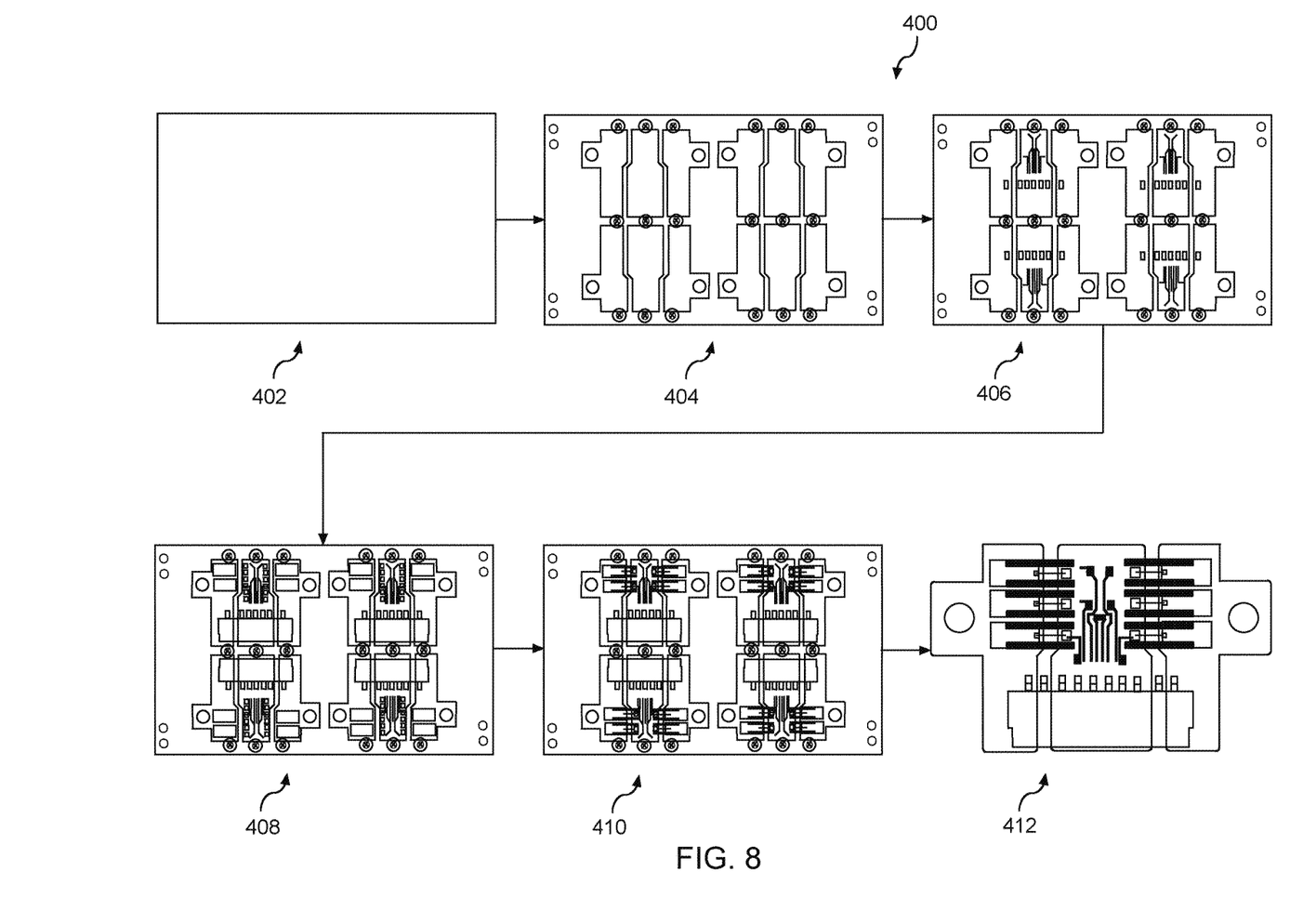
FIG. 8 depicts a flow chart of an example method for manufacturing an electronic power module according to example embodiments of the present disclosure.

FIG. 8 depicts an overview of an example method 400 for manufacturing an electronic power module according to example embodiments of the present disclosure. The method 400 can be used to manufacture any of the electronic power modules described herein, including the electronic power modules described in FIGS. 1-7. FIG. 8 depicts steps performed in a particular order for purposes of illustration and discussion. Those of ordinary skill in the art, using the disclosures provided herein, will understand that various steps of any of the methods described herein can be modified, rearranged, omitted, include steps not illustrated, and/or expanded in various ways without deviating from the scope of the present disclosure.

At (402), a rigid aluminum metal substrate can be provided. The substrate can have a thickness, for instance, in the range of about 0.5 mm to about 3.5 mm, such as about 2.0 mm.

At (404), the method can include punching the aluminum substrate to with the required layout to generate the aluminum substrate sub-elements separated by air gaps. For instance, the aluminum substrate can be punched to create a first aluminum substrate, a second aluminum substrate, and a third aluminum substrate. A first gap can separate the first aluminum substrate from the second aluminum substrate. A second gap can separate the second aluminum substrate from the third aluminum substrate. Bridges can connect the aluminum substrate sub-elements.

At (406), the aluminum substrate sub-elements can be pretreated using a laser pretreatment process and/or a screen printing process to add circuit elements, traces, and connection layers (e.g., metallized layers) for the electronic power module. For instance, thick film deposition of metal layers on the aluminum can be accomplished using the techniques described in U.S. Patent Application Publication 2015/0044360, which is incorporated herein by reference. An example laser pretreatment process is disclosed in U.S. Provisional Application Ser. No. 62/792,153, which is incorporated herein by reference.

At (408) discrete components (e.g., surface mount devices) can be mounted and electrically connected to the aluminum substrate sub-elements (e.g., using surface mount techniques). The discrete components can include the semiconductor switching components (e.g., Silicon MOSFET, Si IGBT, Si FET, SiC MOSFET, SiC Shottky diodes, GaN HEMT, etc.). The discrete components can include sensors, such as current sensors, temperature sensors, voltage sensors, etc. The discrete components can include passive components, such as resistors, diodes, capacitors, pin connectors, bond preforms, etc. At (410), if using bare dies for the semiconductor switching components (e.g., see FIG. 2 and FIG. 4), the semiconductor switching components can be wire bonded and or ribbon bonded to the aluminum substrate sub-elements.

The aluminum substrate sub-elements can then be optionally secured to a heat spreader. The heat spreader can be, for instance, an aluminum sheet having a thickness in the range of about 4 mm to about 6 mm. In some embodiments, the heat spread can be thinner, such as about 1.5 mm to gain height for screwing connections of the power module. The aluminum substrate sub-elements can be secured to the heat spreader via a suitable isolating layer (e.g., adhesive tape).

At (412), the method can include punching the bridges between the aluminum sub-elements to fully separate the aluminum substrate sub-elements. The gaps between aluminum substrate sub-elements can optionally be filled with isolating material, such an epoxy resin, silicone-based material, potting compound, etc. The power electronic module can then be packaged by encasing at least a portion of the aluminum substrate sub-elements in a packaging material (e.g., plastic).

While the present subject matter has been described in detail with respect to specific example embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. An electronic power module, comprising:
    a first aluminum substrate operable at a first potential;
    a second aluminum substrate operable at a second potential, the second aluminum substrate arranged in a common plane with the first aluminum substrate;

a third aluminum substrate operable at a third potential, the third aluminum substrate arranged in a common plane with the first aluminum substrate and the second aluminum substrate;
a first gap separating the first aluminum substrate from the second aluminum substrate;
a second gap separating the second aluminum substrate from the third aluminum substrate;
a first semiconductor switching component electrically coupled to the first aluminum substrate and the second aluminum substrate; and
a second semiconductor switching component electrically coupled to the second aluminum substrate and the third aluminum substrate.

2. The electronic power module of claim 1, wherein the first semiconductor switching component and the second semiconductor switching component are arranged in an anti-serial connection.

3. The electronic power module of claim 2, wherein the first aluminum substrate provides a drain connection for the first semiconductor switching component, the third aluminum substrate provides a drain connection for the second semiconductor switching component, the second aluminum substrate provides a gate connection and a source connection for the first semiconductor switching component and a gate connection and a source connection for the second semiconductor switching component.

4. The electronic power module of claim 3, wherein the second aluminum substrate is arranged between the first aluminum substrate and the third aluminum substrate.

5. The electronic power module of claim 1, further comprising control circuitry disposed on the second aluminum substrate.

6. The electronic power module of claim 1, wherein:
the first semiconductor switching component comprises a drain connection pad, a source connection pad, and a gate connection pad arranged on a same side of a first semiconductor package for the first semiconductor switching component; and
the second semiconductor switching component comprises a drain connection pad, a source connection pad, and a gate connection pad arranged on a same side of a second semiconductor package for the second semiconductor switching component.

7. The electronic power module of claim 6, wherein the first semiconductor package spans the first gap and the second semiconductor package spans the second gap.

8. The electronic power module of claim 7, wherein the drain connection pad of the first semiconductor switching component is die attached to the first aluminum substrate, the drain connection pad of the second semiconductor switching component is die attached to the third aluminum substrate, the gate connection pad and the source connection pad of the first semiconductor switching component is die attached to the second aluminum substrate, and the gate connection pad and the source connection pad of the second semiconductor switching component is die attached to the second aluminum substrate.

9. The electronic power module of claim 1, wherein:
the first semiconductor switching component comprises a drain connection pad, a source connection pad, and a gate connection pad, the drain connection pad and the gate connection pad arranged on opposite sides of a first semiconductor package for the first semiconductor switching component;
the second semiconductor switching component comprises a drain connection pad, a source connection pad, and a gate connection pad, the drain connection pad and the gate connection pad arranged on opposite sides of a second semiconductor package for the second semiconductor switching component.

10. The electronic power module of claim 9, wherein the drain connection pad of the first semiconductor switching component is die attached to the first aluminum substrate, the drain connection pad of the second semiconductor switching component is die attached to the third aluminum substrate, the gate connection pad and the source connection pad of the first semiconductor switching component are wire bonded or ribbon bonded to the second aluminum substrate, and the gate connection pad and the source connection pad of the second semiconductor switching component are wire bonded or ribbon bonded to the second aluminum substrate.

11. The electronic power module of claim 2, wherein the electronic power module is configured as a bidirectional solid state switch.

12. The electronic power module of claim 1, wherein the first semiconductor switching component and the second semiconductor switching component are arranged in a serial connection.

13. The electronic power module of claim 12, wherein the first aluminum substrate provides a drain connection for the first semiconductor switching component, the second aluminum substrate provides a source connection and a gate connection for the first semiconductor switching component, the second aluminum substrate provides a drain connection and a source connection for the second semiconductor switching component, the third aluminum substrate provides a gate connection for the second semiconductor switching component.

14. The electronic power module of claim 13, wherein the second aluminum substrate is arranged between the first aluminum substrate and the third aluminum substrate.

15. The electronic power module of claim 12, wherein:
the first semiconductor switching component comprises a drain connection pad, a source connection pad, and a gate connection pad, the drain connection pad and source arranged on a same side of a first semiconductor package for the first semiconductor switching component;
the second semiconductor switching component comprises a drain connection pad, a source connection pad, and a gate connection pad arranged on a same side of a second semiconductor package for the second semiconductor switching component.

16. The electronic power module of claim 15, wherein the first semiconductor package spans the first gap and the second semiconductor package spans the second gap.

17. The electronic power module of claim 9, wherein the drain connection pad of the first semiconductor switching component is die attached to the first aluminum substrate, the source connection pad and the gate connection pad of the first semiconductor switching component is die attached to the second aluminum substrate, the drain connection pad of the second semiconductor switching component is die attached to the second aluminum substrate, the source connection pad and the gate connection pad is die attached to the third aluminum substrate.

18. The electronic power module of claim 1, wherein:
the first semiconductor switching component comprises a drain connection pad, a source connection pad, and a gate connection pad arranged on opposite sides of a first semiconductor package for the first semiconductor switching component;

the second semiconductor switching component comprises a drain connection pad, a source connection pad, and a gate connection pad arranged on opposite sides of a second semiconductor package for the second semiconductor switching component.

19. The electronic power module of claim 18, wherein the drain connection pad of the first semiconductor switching component is die attached to the first aluminum substrate, the gate connection pad of the first semiconductor switching component is wire bonded or ribbon bonded to the second aluminum substrate, the source connection pad of the first semiconductor switching component is wire bonded or ribbon bonded to the second aluminum substrate, the drain connection pad of the second semiconductor switching component is die attached to the second aluminum substrate, the source connection pad of the second semiconductor switching component is wire bonded or ribbon bonded to the third aluminum substrate, the gate connection pad of the second semiconductor switching component is wire bonded or ribbon bonded to the third aluminum substrate.

20. A method of manufacturing an electronic power module, the power module comprising a first aluminum substrate operable at a first potential; a second aluminum substrate operable at a second potential, the second aluminum substrate arranged in a common plane with the first aluminum substrate; a third aluminum substrate operable at a third potential; the third aluminum substrate arranged in a common plane with the first aluminum substrate and the second aluminum substrate; a first gap separating the first aluminum substrate from the second aluminum substrate; a second gap separating the second aluminum substrate from the third aluminum substrate; a first semiconductor switching component electrically coupled to the first aluminum substrate and the second aluminum substrate; and a second semiconductor switching component electrically coupled to the second aluminum substrate and the third aluminum substrate, the method comprising:

punching the first aluminum substrate, the second aluminum substrate, and the third aluminum substrate from a sheet of aluminum such that the first gap separates the first aluminum substrate from the second aluminum substrate and the second gap separates the second aluminum substrate from the third aluminum substrate; the first aluminum substrate connected to the second aluminum substrate by one or more bridges; the second aluminum substrate connected to the third aluminum substrate by one or more bridges;

screen printing one or more circuit components on the first aluminum substrate, the second aluminum substrate, and the third aluminum substrate;

connecting the first semiconductor switching component to the first aluminum substrate and the second aluminum substrate;

connecting the second semiconductor switching component to the second aluminum substrate and the third aluminum substrate;

attaching the first aluminum substrate, second aluminum substrate, and the third aluminum substrate to a heat spreader via an isolating layer;

punching the one or more bridges connecting the first aluminum substrate and the second aluminum substrate and the one or more bridges connecting the second aluminum substrate and the third aluminum substrate to separate the first aluminum substrate from the second aluminum substrate and to separate the second aluminum substrate from the third aluminum substrate;

covering the first aluminum substrate, the second aluminum substrate, and the third aluminum substrate with a packaging material.

* * * * *